United States Patent [19]

Kitamura

[11] Patent Number: 5,444,245
[45] Date of Patent: Aug. 22, 1995

[54] METHOD OF AUTOMATICALLY SETTING COORDINATE CONVERSION FACTOR

[75] Inventor: Tadashi Kitamura, Tokyo, Japan

[73] Assignee: Seiko Instruments Inc., Tokyo, Japan

[21] Appl. No.: 158,739

[22] Filed: Nov. 30, 1993

[30] Foreign Application Priority Data

Dec. 1, 1992 [JP] Japan ................................ 4-322027

[51] Int. Cl.⁶ ............................................. H01J 37/26
[52] U.S. Cl. ................................................. 250/307
[58] Field of Search .................... 250/307, 491.1, 492.2

[56] References Cited

U.S. PATENT DOCUMENTS

| | | | |
|---|---|---|---|
| 4,442,361 | 4/1984 | Zasio et al. | 250/491.1 |
| 4,814,682 | 3/1989 | Yamada | 318/640 |
| 5,172,402 | 12/1992 | Mizusawa et al. | 378/34 |
| 5,208,763 | 5/1993 | Hong et al. | 364/551.02 |

*Primary Examiner*—Bruce C. Anderson
*Attorney, Agent, or Firm*—Spensley Horn Jubas & Lubitz

[57] ABSTRACT

A method of automatically setting a coordinate conversion factor in which, under the condition where a sample having a simple contour, such as a wafer with a known contour, is installed in a shape observing unit, in order to determine the conversion factor between a coordinate system defined by the contour of the sample and a control coordinate system for an observing position such as a stage coordinate system, the edge position of the contour of the sample is automatically recognized at a high accuracy from a secondary electron picture which has been obtained from the shape observing unit, from the result of which the conversion factor between the sample coordinate system and the stage coordinate system is automatically set.

3 Claims, 6 Drawing Sheets

$Xd, Yd, Od$ : SAMPLE COORDINATE SYSTEM
$Xs, Ys, Os$ : STAGE COORDINATE SYSTEM $Xd, Yd, Od$ : SAMPLE COORDINATE SYSTEM
$Xs, Ys, Os$ : STAGE COORDINATE SYSTEM

×: EDGE POINT

●: REPRESENTATIVE EDGE POINT

●: REPRESENTATIVE EDGE POINT

× : EDGE POINT

● : REPRESENTATIVE EDGE POINT

● : REPRESENTATIVE EDGE POINT

METHOD OF AUTOMATICALLY SETTING COORDINATE CONVERSION FACTOR

BACKGROUND OF THE INVENTION

1. Field of the Invention

The present invention relates to a device, such as an electron microscope, a laser microscope, a scanning probe microscope or the like, for observing minute structures, and particularly to a method of automatically setting a coordinate conversion factor in such an observing device.

2. Description of the Related Art

When observing a specified minute structure on a sample through a shape observing device, it is required that a coordinate value of the minute shape in a sample coordinate system be converted into a coordinate value in a stage coordinate system. Hitherto, as a method of obtaining the factor of conversion between the distinct coordinate systems, the following two methods have been used.

In a first method, a conversion factor at a predetermined position has been calculated in advance, and while detecting a position of the contour of each sample by a sensor or the like, the sample is mounted at the predetermined position, thereby to utilize the above-mentioned conversion factor.

In a second method, an operator searches for an objective such as a distinctive point of the contour of a sample, a positioning mark or the like, a coordinate position of which has been previously known, and then calculates a required number of coordinate values in both of the sample coordinate system and the stage coordinate system, from the result of which the conversion factor is calculated.

However, in the above first method, a machine control mechanism for detection of an optimum position is required, resulting in a complicated device structure.

In the above second method, the operation performed by the operator is troublesome and the accuracy in the conversion factor is degraded by an error of an objective position input depending upon the degree of proficiency of the operator.

SUMMARY OF THE INVENTION

In view of the above, an object of the present invention is to eliminate the above problems with the conventional methods.

The above and other objects of the invention have been achieved by provision of a method of automatically setting a coordinate conversion factor in which, under the condition where a sample having a simple contour such as a wafer or the like with a known contour value (hereinafter referred to as the "sample") is installed in a shape observing unit, in order to obtain the factor of conversion between a coordinate system defined by use of a contour of a sample (hereinafter referred to as the "sample coordinate system") and a control coordinate system for an observing position such as a stage coordinate system (hereinafter referred to as the "stage coordinate system"), the edge position of the contour of the sample is automatically recognized with a high accuracy from a secondary electron picture or the like (hereinafter referred to as the "picture") which has been obtained from the shape observing unit, from the result of which the factor of conversion between the sample coordinate system-and the stage coordinate system is automatically set.

In the method of the present invention, in order to limit an edge observing range, the accuracy in a position where a sample is installed is made equal to or less than a given value by a high-accuracy sample mounting unit. A coordinate value in the stage coordinate system for observing points of the contour of a sample necessary for determining the sample coordinate system is preliminarily obtained for every sample contour value.

First, an image in a field of view which covers an error in the sample mounting position is obtained by moving to a first observing point. From the image thus obtained, an edge is detected. Then, the observing point is moved in such a manner that the detected edge comes to a center of the field of view. Under this circumstance, the edge is detected again in a field of view necessary for satisfying the accuracy of the conversion factor, thereby obtaining a coordinate value in the stage coordinate system.

The above-mentioned operation is conducted for all the observing points, from the result of which the factor of conversion between the coordinate systems is calculated.

BRIEF DESCRIPTION OF THE DRAWING

Other objects, advantages and features of the invention will be apparent when carefully reading the following detailed description in connection with the accompanying drawings, in which.

DESCRIPTION OF THE PREFERRED EMBODIMENTS

Now, an embodiment of the present invention will be described with reference to the accompanying drawings.

Figure 1:
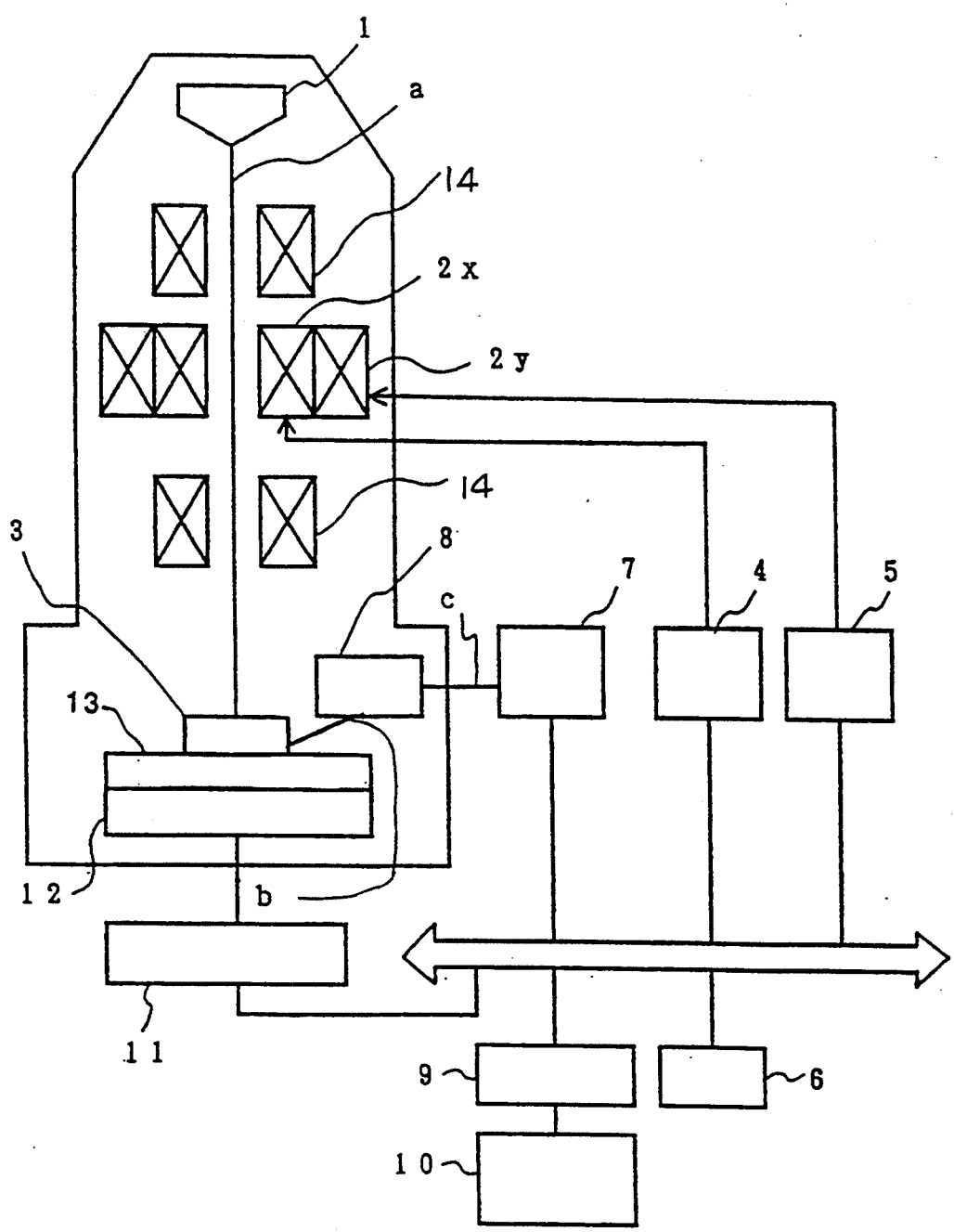
FIG. 1 is partly a pictorial view and partly a block diagram showing a device for automatically setting a conversion factor according to an embodiment of the present invention.

FIG. 1 shows a device for automatically setting a conversion factor according to an embodiment of the present invention. An electron beam "a" generated by an electron gun 1 is deflected in an X-direction by an X-deflection system $2x$, and is deflected in a Y-direction by a Y-deflection system $2y$. The X and Y directions may be, for example, parallel and perpendicular, respectively, to the plane of FIG. 1, Beam deflection is controlled by outputs from a first D/A converter 4 for the X-direction and a second D/A converter 5 for the Y-direction. The outputs of the first and second D/A converters 4 and 5 are connected to the X- and Y-deflection systems $2x$ and $2y$.

When a CPU 6 executes a read operation for an A/D converter 7, electrons "b" emitted from a sample 3 are detected by a detector 8, and the value of a converted electric signal "c" output from the detector 8 is converted by converter 7 into a digital quantity which is taken into the CPU 6.

The CPU 6 writes a value written from the A/D converter 7 into a picture memory 9. The contents of the picture memory 9 are displayed on a display unit 10.

The sample 3 is installed in a high-accuracy sample mounting unit 13 and an observing position of the sample 3 is controlled through a stage drive unit 12.

The amount of movement of the stage is outputted from the CPU 6 to a stage control unit 11. The output of the stage control unit 11 is connected to the stage drive unit 12. Reference numeral 14 denotes a beam focussing lens.

Figure 2:
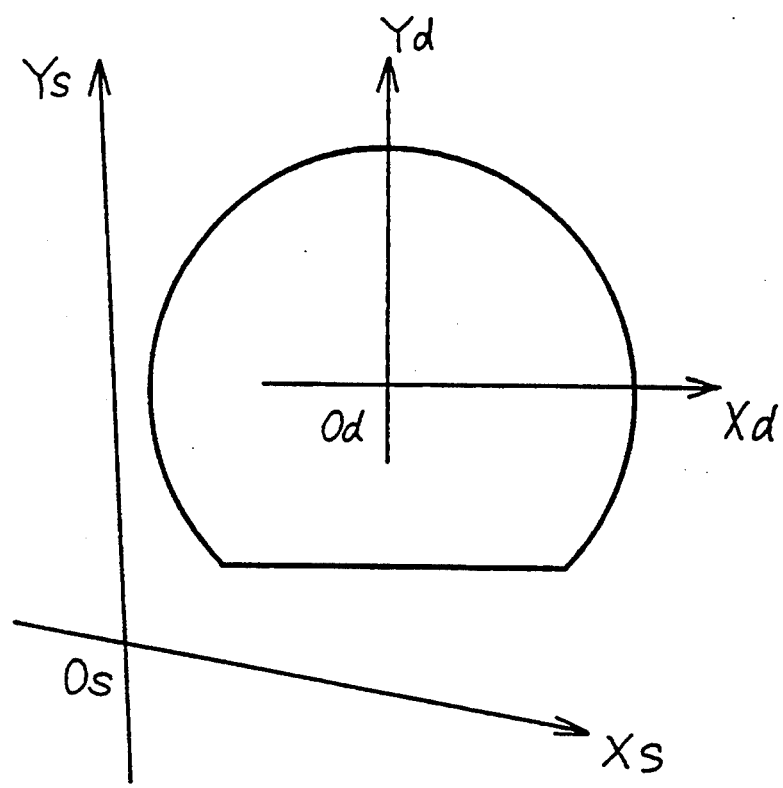
FIG. 2 is a pictorial plan view of an example of a sample and a coordinate system.

FIG. 2 shows a sample coordinate system and a stage coordinate system in which, in a wafer having one orient flag, the origin of the sample coordinate system is the center Od of a circle and the X-coordinate, Xd, runs parallel to the orient flag.

Figure 3:
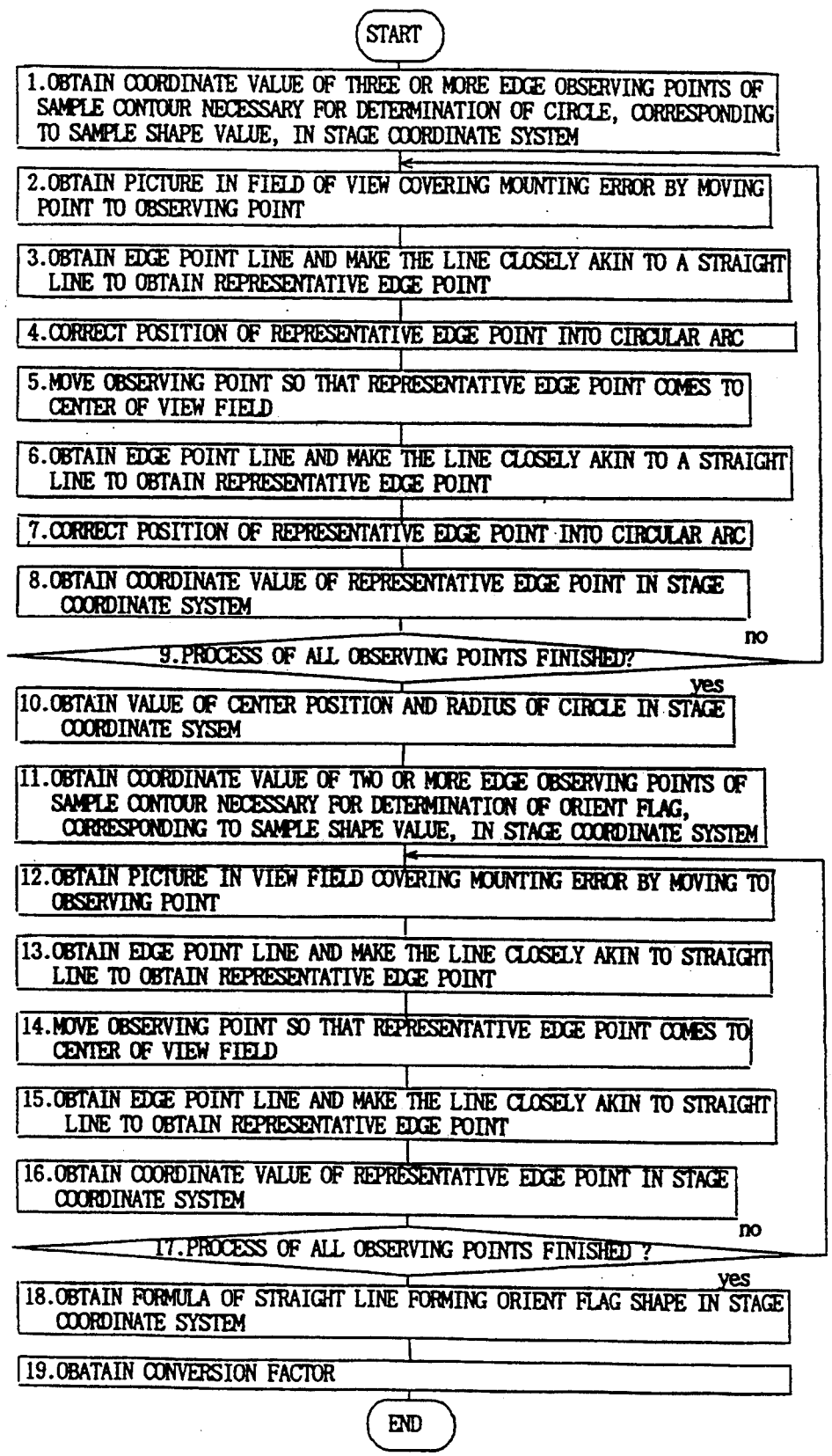
FIG. 3 is a flow chart representative of a method of automatically setting a conversion factor according to the invention.

In this case, a procedure for obtaining a conversion factor will be described with reference to a flow chart shown in FIG. 3.

As process step 1, the circular shape of the sample contour is obtained. The coordinate values of three or more edge observing points of the sample contour necessary for determination of a circle in the stage coordinate system are obtained for every sample contour value. These observing points are selected in such a manner that they are satisfactorily spaced from each other and also other sample contours are not within the field of view.

In process step 2, an image, or picture, in a field of view which covers an error in a sample mounting position is obtained by moving to a first observing point. In process step 3, a line of edge points is detected from the picture thus obtained. There is a case where the picture representative of the edge of the sample 3 is obtained as a picture having a ring shape that the inside of the sample is penetrated. Only the point line outside of the edge is detected so as to cope with such a picture.

Figure 4:
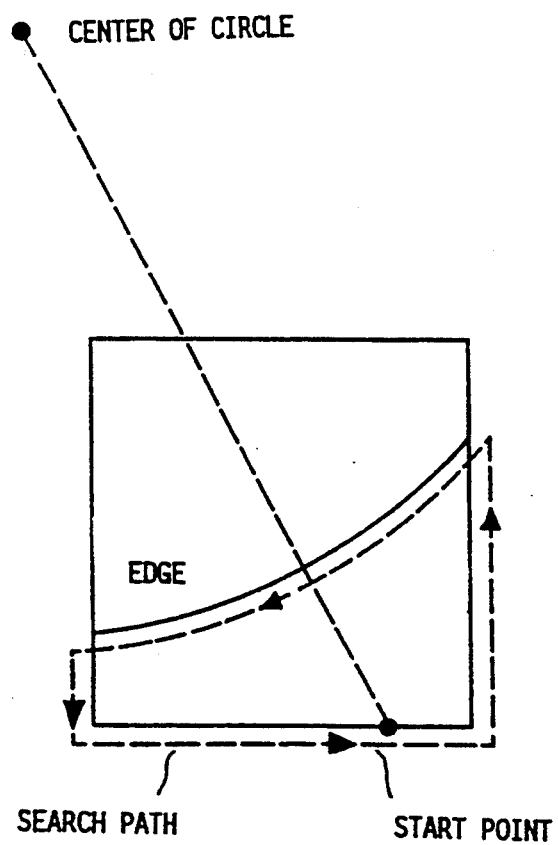
FIG. 4 is a pictorial plan view illustrating a method of searching for an edge.

Referring to FIG. 4, one point on the outermost frame of the picture is obtained in a region outside of the circle on the basis of a positional relationship with respect to the center of the edge circle, and then a closed curve formed by a part of the outermost frame and the edge is obtained in any one of the clockwise or counterclockwise from this point. First, the edge is searched for along the outermost frame. If the edge has been found out, then the outermost frame is searched for along the edge. If the outermost frame has been found out, the initial edge search is carried out. If it arrives at the start point during this process, then the process is finished. The line of the edge points thus obtained is closely akin to a straight line by means of a straight line approximation in a two dimensional space. A point on the obtained straight line corresponding to the center of the edge dot line is regarded as a representative edge point.

In process step 4, if the line of edge points is on a circular arc, then the amount of the displacement between the representative edge point of the straight line approximation and the representative edge point on the circular arc is calculated from the radius and length of the circular arc, and then corrected. From a distance between the representative edge point and the center of a field of view on the picture, a distance therebetween on the stage coordinate system is obtained. From this distance, in process step 5 the observing point is moved in such a manner that the representative edge point comes to the center of the field of view.

Thereafter, the picture is obtained in the field of view necessary for satisfactory accuracy of the conversion factor. In process steps 6 and 7, this picture is subjected to the process in the above-described manner to obtain a distance between the edge and the center of the field of view in the stage coordinate system. From this distance and the position of the observing point, the coordinate value of the edge in the stage coordinate system is obtained in process step 8.

The above-described operation is executed for all the observing points as represented by decision block 9, from the result of which the values of the center position and the radius of the circle in the stage coordinate system is obtained in process step 10.

As a second process, the shape of the orient flag is obtained. As the representative points required for determination of the shape of the orient flag, the values of two or more edge positions of the orient flag in the stage coordinate system are obtained in process step 11. Then process steps 12–17 are performed, which are similar to process steps 2, 3, 5, 6, 8 and 9, respectively. From this result, the formula of a straight line forming the shape of the orient flag in the stage coordinate system is obtained in process step 18.

The conversion factor is finally obtained in process step 19 on the basis of the result of the above process and the scale between both coordinate systems. In the case of other samples having a different shape or other coordinate systems, a circle, an ellipse or a straight line is detected in the same manner as described above, thereby obtaining a conversion factor.

Figure 5:
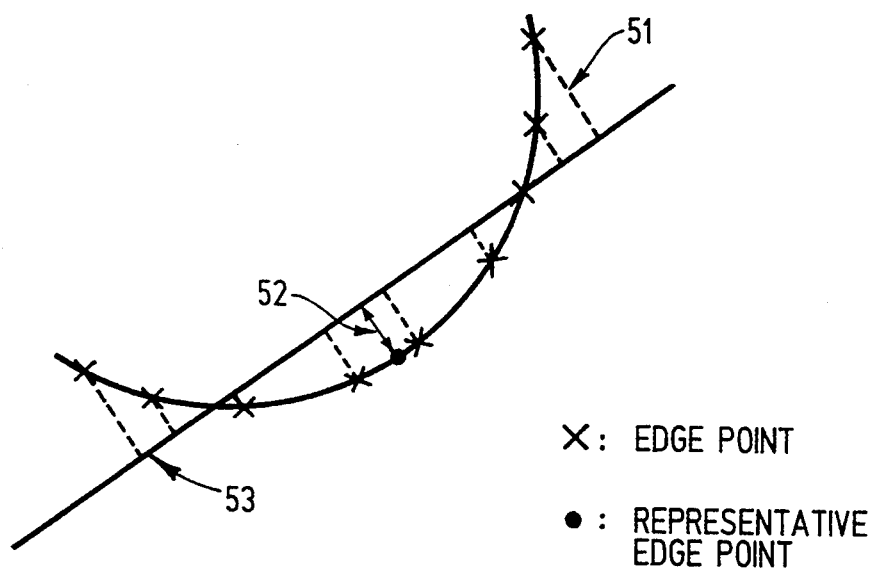
FIGS. 5, 6, 7 and 8 are diagrams illustrating image processing operations according to the invention.

FIG. 5 shows how to obtain a representative edge point. After obtaining an edge point line 51, an approximate straight line 53 can be obtained by the least squares method; that is, the approximate straight line 53 can be obtained by minimizing a summation of squares of deviations 52 between the edge points on line 51 and the approximate straight line 53. A point on the obtained straight line 53 corresponding to the center of the edge point line is regarded as a representative edge point.

Figure 6:
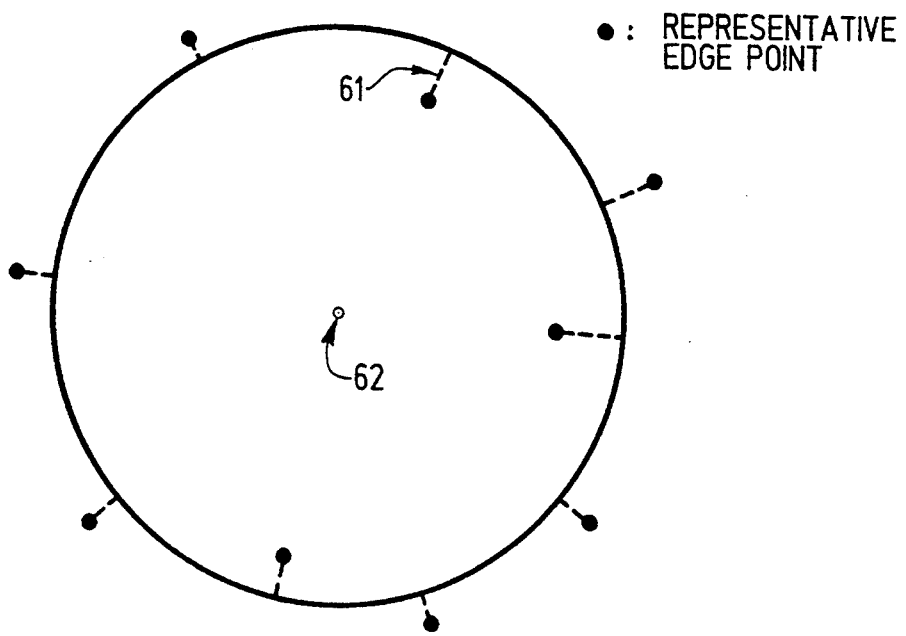

FIG. 6 shows how to obtain the center of the circle using the representative points obtained in the manner described above with reference to FIG. 5. The circle can be also obtained by the least squares method. The center 62 of the circle, is obtained by minimizing a summation of squares of deviations 61 between the circle and the representative edge points, wherein at least three representative edge points are needed. The circle is regarded as a part of the external form of the wafer.

Figure 7:
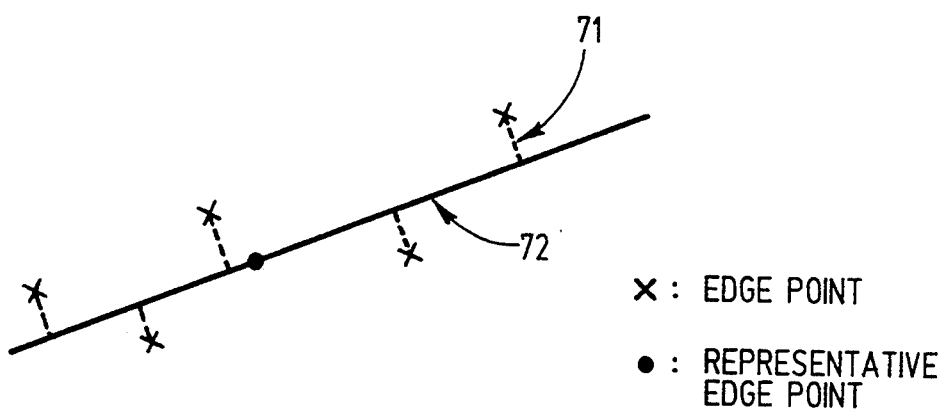

FIG. 7 shows how to obtain representative edge points by the least squares method using deviations 71 between an edge point and an approximate straight line 72 corresponding to the orient flag of the wafer.

Figure 8:
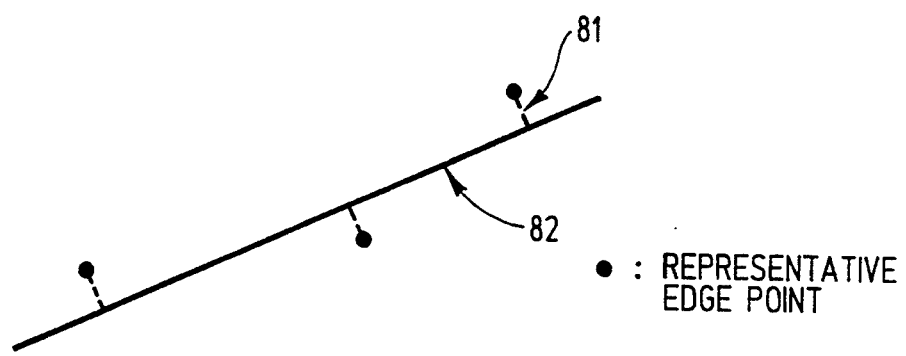

FIG. 8 shows how to obtain an approximate straight line corresponding to the orient flag of the wafer by the least squares method using deviations 81 between the representative edge points obtained as described with reference to FIG. 7 and the approximate straight line 82.

According to the present invention, a special machine and control function are not required exclusive of a simple high-accuracy sample mounting unit, and difficulties which would otherwise be encountered by an operator and accuracies in the conversion factor due to lack of proficiency of the operator are eliminated, as a result of which the high-accurate conversion factor can be calculated at a high speed.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

This application relates to subject matter disclosed in Japanese Application number 4-322027, filed on Dec. 1, 1992, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. A method of automatically setting a coordinate conversion factor between a first coordinate system which is fixed with respect to an edge contour of a sample and a second coordinate system which is fixed with respect to an observing unit, the observing unit being operative to produce an image of sample edge contour, the sample being mounted on a holding stage which is movable relative to the observing unit, the sample edge contour having a circular portion and the sample size and contour being known, the method comprising the steps of:
   a) placing the sample on the holding stage;
   b) moving the stage to bring a portion of the sample which includes at least a part of the contour circular portion to a position for observation by the observing unit and obtaining an image of the part of the contour circular portion;
   c) deriving data representing the location of points on the circular contour portion with respect to the second coordinate system;
   d) deriving data representing a straight line approximating the circular contour portion and data representing a selected point on the straight line which corresponds to a point at the center of the circular contour portion;
   e) deriving data representing a point on the circular contour portion which corresponds to the selected point on the straight line;
   f) repeating steps b)-e) for successive positions for observation to derive data representing points associated with different parts of the circular contour portion;
   g) determining the radius and center of curvature of the contour circular portion on the basis of the data representing points on the circular contour portion derived in steps e) and f); and
   h) obtaining a coefficient for a conversion factor between the first and second coordinate systems on the basis of the determination made in step g).

2. A method as defined in claim 1, wherein the sample contour further has a linear portion, comprising the further steps of:
   i) moving the stage to bring a part of the linear portion to the position for observation by the observing unit and obtaining an image of the part of the linear contour portion;
   j) deriving data representing the location of points on the linear contour portion with respect to the second coordinate system;
   k) deriving data representing a straight line approximating the linear contour portion and data representing a selected point on the straight line;
   l) repeating steps i)-k) for successive positions for observation to derive data representing points associated with different parts of the linear contour portion; and
   m) deriving a formula representing the linear contour portion on the basis of the data representing selected points derived in steps k) and l);
   wherein the formula derived in step m) is used in said step of obtaining a coefficient.

3. A method as defined in claim 1 wherein the sample edge contour is an exterior edge contour of the sample.

* * * * *